(12) United States Patent
Skrobis

(10) Patent No.: US 6,497,995 B2
(45) Date of Patent: *Dec. 24, 2002

(54) METHOD OF MACHINING GLASS

(75) Inventor: Amy V. Skrobis, Redmond, WA (US)

(73) Assignee: AlliedSignal Inc., Morristown, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/350,323

(22) Filed: Jul. 9, 1999

(65) Prior Publication Data
US 2002/0110754 A1 Aug. 15, 2002

Related U.S. Application Data
(60) Provisional application No. 60/131,610, filed on Apr. 29, 1999.

(51) Int. Cl.$^7$ .................................................. G03C 5/00
(52) U.S. Cl. ...................... 430/323; 430/322; 430/313; 430/316; 430/318; 430/330; 216/41
(58) Field of Search ................................. 430/313, 314, 430/316, 318, 322, 323, 324, 325, 330; 216/43, 55, 41

(56) References Cited

U.S. PATENT DOCUMENTS 4,983,250 A * 1/1991 Pan ............................ 156/628
4,902,607 A * 2/2000 Lee ............................ 430/323

* cited by examiner

Primary Examiner—Mark F. Huff
Assistant Examiner—Saleha R. Mohamedulla

(57) ABSTRACT

A low cost, durable mask for use in structuring anodically bondable glass materials and other structurable glass materials.

19 Claims, 1 Drawing Sheet

METHOD OF MACHINING GLASS

This application claims the benefit of U.S. Provisional Application Ser. No. 60/131,610, filed in the name of Amy V. Skrobis on Apr. 29, 1999.

BACKGROUND OF THE INVENTION

The present invention relates generally to etch masks for microstructuring of glass materials and particularly, to photolithographically created durable chromium-based laminate etch masks for use in microstructuring anodically bondable glass materials or other glass materials used in sensor fabrication, such as quartz and fused silica.

Silicon and various types of glass are widely used in microsensor and microactuator technologies because they are formable into microstructures, commonly referred to as being "microstructurable," and because they provide other advantageous properties, including: electrical insulation, resistance to many chemicals, transparency at some wavelengths, and joinability to many different metals. The most significant requirements for materials used in the microsystem technologies are that the glass be microstructurable, preferably using a standard photolithography batch process; contain easily movable ions for anodic bonding; and have a thermal expansion coefficient essentially matching the thermal expansion coefficient of silicon to avoid thermal stresses at the interface. Thus, the preferred materials for use in microsystem technologies are both easy to structure using standard photolithography batch process techniques and easy to anodically bond. Generally, however, the chemical composition of anodically bondable glass materials causes etching difficulties while easily microstructurable glass materials are generally difficult to bond because of thermal expansion coefficients which are not well matched to the thermal expansion coefficient of silicon and/or the absence of easily movable positive sodium ions for anodic bonding. One anodically bondable glass materials commonly used in microsensor and microactuator technology are borosilicate Pyrex™ 7740 glass available in wafers from Coming Inc. of Corning, N.Y. Other glass materials that are easy to structure using standard photolithography batch process techniques are commonly used in sensor fabrication. Such materials include quartz and fused silica, for example, high purity fused silica Coming™ 7980 glass wafers, also available from Corning Inc., are used in the manufacture of some structured glass sensors.

One known method for structuring both anodically bondable glass materials and other structurable glass materials is electro-chemical discharge drilling which includes, for example, chemical-assisted laser etching and focused ion beam enhanced etching. Other known drilling methods use mechanical drills, ultrasonic drills, focused ion beam drills, both eximer and carbon dioxide laser drills, and micro-sandblasting. While these glass drilling methods obtain straight walls, these methods provide neither the accuracy desired in microsystems nor the desired batch processing capabilities. Rather, these methods are generally incur relatively high costs, both in terms of the equipment required in the processing and the process cycle time.

Batch processing methods for microstructuring are necessary to the practical use of both anodically bondable glass materials and other structurable glass materials used in sensor fabrication, such as quartz and fused silica. One common microstructuring batch process involves masking portions of the glass wafers and etching the desired details into those portions of glass exposed by the mask. Photolithography is commonly used to define a mask material resistant to the etchant. Thus photolithography provides a process whereby mask details are accurately registered on batch quantities of glass wafers. However, the known methods of photolithographically depositing mask materials are costly and, in the case of polysilicon deposition, extreme cleanliness is required for high quality machining. A major limitation of currently available masking techniques is undercutting of the mask due to poor adhesion to the glass. The undercutting causes an expansion of the mask details within the glass wafer which leads to poor resolution of the details.

An article by Corman, Enoksson and Stemme entitled Deep Wet Etching of Borosilicate Glass Using an Anodically Bonded Silicon Substrate as Mask, published in the Journal of Micromaching and Microengineering, Vol. 8 (1998) at pages 84–87 detailed a method of deep etching in borosilicate glass using an anodically bonded silicon substrate as a mask in a standard lithography technique. The method was developed using 500 micrometer thick borosilicate Pyrex™ 7740 glass wafers. The masking layer was a silicon wafer previously microstructured in a potassium hydroxide (KOH) solution and anodically bonded to the glass wafer. The substrates then submerged in a solution of 50% hydrofluoric (HF) acid mixed with water in a 1:5 concentration. Although the method disclosed may be realizable using a standard lithography batch process, the method results in an undesirable lateral undercutting 1.5 times larger than the etch depth.

Another method for structuring both anodically bondable glass materials and other structurable glass materials uses a polysilicon film deposited by low pressure chemical vapor deposition or LPCVD on a 500 micrometer thick Pyrex™ glass wafer as detailed in an article by Grétillat, Thlébaud, Koudelka-Hep and de Roolj entitled A New Fabrication Method of Borosilicate Glass Capillary Tubes With Lateral Inlets and Outlets, published in the Proceedings of *Eurosensors* (1996) at pages 259–62. This polysilicon film method is reportedly compatible with standard lithography techniques but, during the high temperature LPCVD deposition process, the $Na^+$ ions diffuse out of the glass and contaminate the furnace. This contamination seriously degrades the electrical characteristics of silicon so that the costly furnace is only usable thereafter for "unclean" applications. A similar method using plasma enhanced chemical vapor deposition or PECVD silicon carbide as a mask was reported by Flannery, Muurlos, Storment, Tsai, Tan, and Kovacs in an article entitled PECVD Silicon Carbide for Micromachined Transducers, in the proceedings of *Transducers* '97 at pages 217–20.

Other known methods for structuring glass materials use etch masks formed of chromium, gold and resist wherein the chromium layer improves adhesion to the glass substrate. Although simple when compared with standard lithography techniques, these methods fail when applied to etch depths over about 50 micrometers because pin holes develop with prolonged exposure to the hydrofluoric acid etchant. Moreover, a substantial lateral under etching of chromium occurs caused by a high etch rate at the glass-chromium interface. If the process is continued, this lateral undercutting results in complete separation of the mask from the glass wafer. While this lateral undercutting can be reduced by heating the glass substrate before and after the chromium mask deposition to diffuse some of the chromium into the substrate, adhesion to the glass substrate remains poor and the mask exhibits poor resistance to the etchant. The poor adhesion and poor resistance to HF generally limits use of this type of mask to shallow etchings of 50 micrometers or less.

This a need exists for a process of microstructuring anodically bondable glass materials and other structurable glass materials realizable in a low cost batch process and yielding accurately located, high resolution, high aspect ratio features.

SUMMARY OF THE INVENTION

The present invention overcomes the limitations of the prior art by providing low cost, durable masks for use in etching of anodically bondable glass materials and other structurable glass materials. The masks of the present invention are formed by first depositing a protective layer onto a surface of the glass substrate blank, then forming the desired mask details in the protective layer and hard-baking the resulting structure. According to one aspect of the invention, the protective layer is formed of a first adhesion layer, preferably chromium metal, deposited on the cleaned surfaces of the glass substrate. The chromium layer is deposited thickly enough to endure exposure to a glass etchant solution during subsequent etching of the glass substrate. Alternatively, a second protective metallic layer is deposited over the underlying chromium layer using, for example, gold, platinum, copper, and nickel or another suitable material.

According to another aspect of the invention, the desired mask details are formed in the protective layer by lithographically defining the mask details and etching the exposed portions of the protective layer. The mask details are preferably defined using conventional photolithography techniques wherein a layer of photoresist laminate is applied over the protective layer and the desired details are defined in the resist by exposing and developing the material. In a preferred embodiment of the invention, the photoresist laminate coat is a negative resist laminate applied using a heated roll-bonding process.

According to another aspect of the invention, the hard-baking of the protective layer is performed by exposing the resulting structure to a predetermined elevated temperature in the approximate range of 140° C.+/−2° C. for a predetermined time period in the approximate range of 1+/−0.25 hours.

According to other aspects of the present invention, a method is provided for structuring glasses, particularly anodically bondable substrate materials and other glass ubstrate materials such as fused silica, quartz, or another structurable glass substrate material. The method of the invention includes cleaning the glass substrate blank, depositing a protective metallic adhesion layer onto the surfaces of an glass substrate and defining the desired mask details on the protective layer, the mask details are formed in the protective layer and the whole is hard-baked to complete the mask. The structurable glass substrate is etched in those areas exposed by the mask details. Then, the etched substrate is rinsed and dried and the photoresist is stripped.

According to one aspect of the invention, the mask details are formed in the protective layer by photolithographically defining the mask details in a layer of negative photoresist laminate.

According to one aspect of the invention, the protective metallic adhesion layer is formed either of a relatively thick layer of chromium or of a relatively thin layer of chromium in combination with a second layer formed of some material that is resistant to buffered oxide etchant (BOE) solutions effective for etching the glass substrate material. The second layer of the protective layer is a metal selected from any metal that is resistant to BOE solutions, including gold, platinum, copper, nickel and any other suitable metal or metal alloy. The glass substrate blank, including the protective layer, is baked at a predetermined elevated temperature in the approximate range of 140° C.+/−2° C. for a predetermined time period in the approximate range of 1+/−0.25 hours.

According to another aspect of the invention, the glass substrate blank with the protective layer adhered thereto is exposed to a BOE solution heated to a temperature in the approximate range of 60° C. to 70° C.

DETAILED DESCRIPTION OF THE PREFERRED EMBODIMENTS

Figure 1:
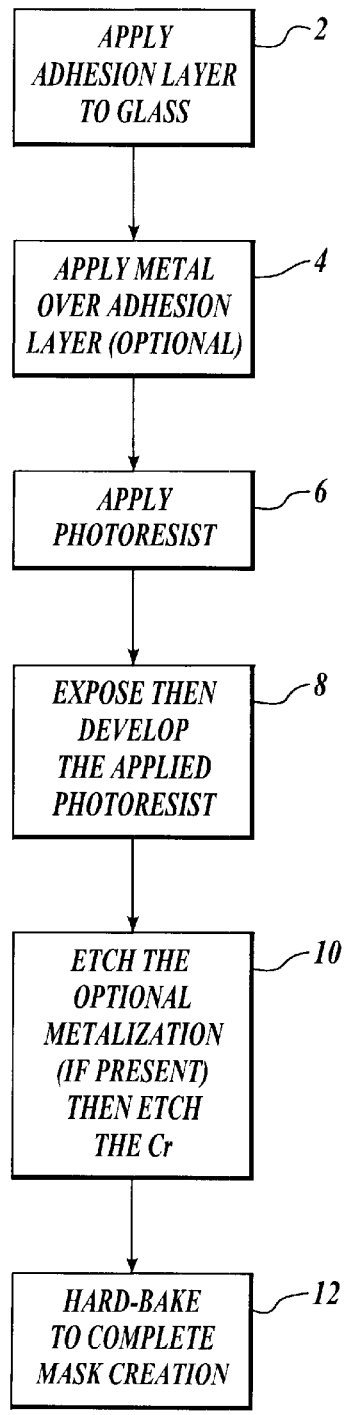
FIG. 1 illustrates a flow chart of the process of the present invention.

FIG. 1 shows a flow chart of the process for manufacturing the low cost, durable masks of the present invention. According to the process outlined in FIG. 1, one or more metal layers are deposited onto one or more structurable glass substrates. This metalization layer serves as an adhesion layer for a negative photoresist laminate, which is preferably applied using a conventional heated roll-bond laminator. The mask details are photolithographically defined on the substrate, the underlying metal layers are etched and the substrate is then hard-baked. The resulting laminated substrate can be etched to depths well in excess of 700 micrometer and for periods of time over 24 hours in buffered oxide etchants (B0E).

In Block 2 of FIG. 1, a layer of chromium (Cr) is applied to a structurable glass substrate to provide an adhesion layer for any additional masking layers. This chromium layer is applied to the substrate using any available metal deposition technique, for example, conventional thermal evaporation, sputtering, or another suitable metal deposition technique. The structurable glass substrate is preferably formed of fused silica, quartz, borosilicate or another suitable structurable glass substrate material. The Cr layer both forms an adhesion layer for a later photoresist layer or for an optional second metalization layer and protects portions of the substrate during a subsequent etching process. In Block 4, an optional second metalization layer is applied over the Cr layer using any available metal deposition technique. This optional second metalization layer is preferably formed of a material and having a thickness suitable to avoid the time-based pin-hole effects known to occur in thin layers of Cr. Unless this second metalization layer is applied, the Cr layer is preferably applied thickly, relative to an embodiment including the optional additional metalization layers, to avoid these time-based pin-hole effects which limit the etch depth possible in the prior art. If the invention is practiced using only a Cr metalization layer, the Cr is preferably deposited having sufficient thickness to allow etching of the substrate to the desired depth without developing detrimental pin-holes. In Block 6, a layer of photoresist, preferably negative photoresist, is applied over the metalization layer or layers by performing a conventional heated roll-bond. The photoresist is exposed and developed in Block 8, whereby the mask details are defined. In Block 10, the one or more metalization layers are separately etched: any secondary metalization layer is etched first followed by etching of the underlying Cr metalization layer, whereby the mask details are defined in the one or more metalization layers. In Block 12, the portions of the photoresist and metalization layers remaining after the etching of Block 10 are hard baked to complete the mask. Those of ordinary skill in the art will appreciate that the optional secondary metalization layer is formed of any material that is resistant to HF etchant solutions, such as BOE. Accordingly, the optional secondary metalization layer is formed of any suitable material, including but not limited to any of gold, platinum, copper, nickel, or another suitable material.

Figure 2:
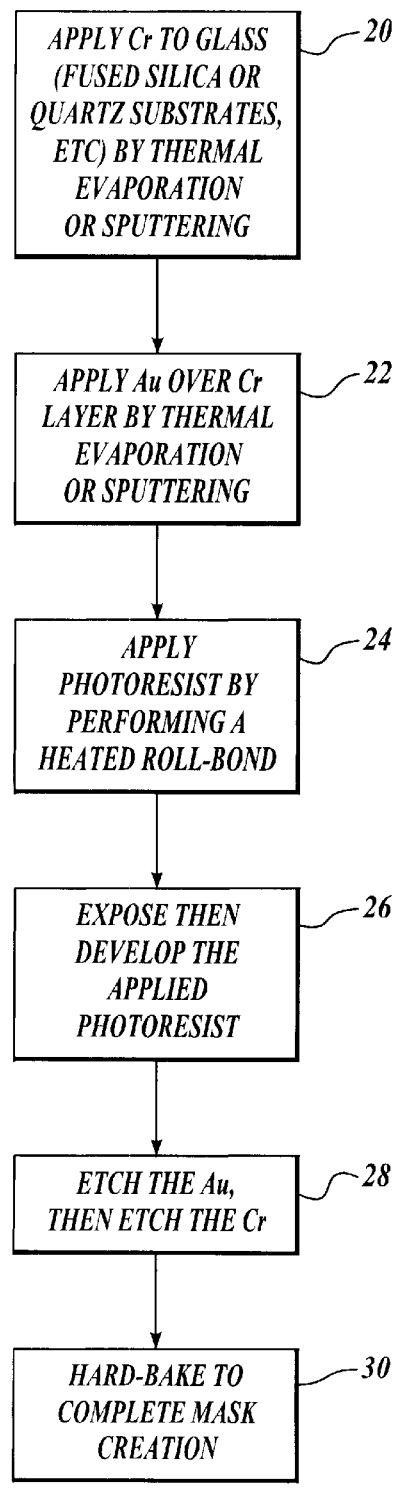
FIG. 2 illustrates a flow chart of one preferred embodiment of the process of the present invention.

FIG. 2 shows a flow chart of one preferred embodiment of the present invention. In FIG. 2 at Block 20, a thin layer of chromium (Cr) on the order of 100 Å (Angstroms) is first applied to a glass substrate such as fused silica, quartz substrates, borosilicate or another structurable glass material preferably using a conventional thermal evaporation or sputtering technique. In this preferred embodiment, the Cr metalization layer provides an adhesion layer for an additional metalization layer. At Block 22, a second metalization layer of gold (Au) is applied over the Cr layer, preferably using thermal evaporation or sputtering. The Au metalization layer interlocks to the Cr layer and is preferably deposited having a thickness sufficient to protect the Cr layer from developing undesirable pin-holes during etching of the glass substrate. For example, a Cr metalization layer of about 100 Å thick is protected by a Au metalization layer about 2500 Å thick for etching a 760 micrometer thick glass substrate through its thickness. This metalization layer also serves as an adhesion layer for a photoresist laminate. At Block 24, a layer of photoresist, preferably negative photoresist, is applied over the Au metalization layer by performing a heated roll-bond technique. The photoresist is a material that is resistant to metal etchants effective for removing the underlying metalization layers applied in Block 20 and Block 22. The photoresist is then exposed and developed to provide the mask details, at Block 26. At Block 28, the Au and Cr metalization layers are separately etched: the Au metalization layer is etched first followed by etching of the underlying Cr metalization layer. The portions of the Au metalization layer exposed by the process of Block 26 are first etched to form the mask details in the Au and expose corresponding portions of the Cr metalization layer, then the portions of the underlying Cr metalization layer are etched to expose corresponding portions of the glass substrate. At Block 30, the layers of photoresist, Au and Cr that remain after exposure and development described in Block 26 and the etching described in Block 28 are hard baked to complete creation of the mask. As noted above, the Au metalization layer is alternatively replaced by other suitable metals that are resistant to HF etch solutions, such as BOE. Or, according to another alternative embodiment, the Au metalization layer is eliminated and replaced by a thicker self-protecting layer of Cr. A self-protecting Cr metalization layer is preferably about 2500 Å+/−500 Å thick for etching the 760 micrometer thick glass substrate through its thickness.

The following describes an exemplary application of the method of the above identified invention. A batch quantity of 0.030 inch (760 micrometer) thick fused silica substrate blanks are cleaned. One effective cleaning method includes exposure to a peroxide/sulfuric acid solution, commonly known in the art as a "Piranha clean," followed by a spin-rinse-dry cycle at about 300 RPM for about 5 minutes, then about a 6 second dip in a 10:3 solution of HF and acetic acid followed by a second spin-rinse-dry cycle at about 300 RPM for about 5 minutes and a plasma clean using a conventional plasma cleaner. A Cr layer about 100 Å+/−50 Å thick is evaporated onto each cleaned substrate blank followed by a Au layer about 2500 Å+/−250 Å thick.

A dry film photoresist laminate of a type commonly used in printed circuit board manufacture is applied to 0.030 inch thick fused silica substrate blanks using a conventional heated roll-bonder at a relatively low pressure. The laminator pressure is preferably about 20 pounds per square inch; the laminator roll temperature is preferably about 234° F.+/−5° F.; and the laminator feed rate is preferably about 2 feet/minute. The dry film laminate is then exposed for a predetermined period of time. For example, according to the present embodiment, the dry film laminate is exposed using a broad spectrum Hg-UV source for about 8 seconds. The exposed laminate is developed, for example, for about 5 minutes+/−15 seconds in an agitated 1% by weight $Na_2 CO_3$ solution at room ambient temperature. After the laminate is patterned, the Au metalization layer is etched using, for example, a $KI/I_2$ solution for about 2 minutes+/−15 seconds at room ambient temperature. The Au metalization etch is followed by a Cr etch using, for example, a $K_2 Cr_2 O_7/HNO_3$ solution for about 1 minute+/−15 seconds also at room ambient temperature. The laminated substrate blanks are then hard-baked. For example, the laminated substrate blanks are baked for about 1 hour+/−0.01 hour at a temperature of about 140° C.+/−2° C. The laminated and hard-baked substrate blanks are etched in a heated HF etchant solution, for example, a 10:1 BOE solution heated to about 60–70° C. Different concentrations of BOE, i.e., different $NH_4F$:HF solutions, are also effective in practicing the invention to etch a desired geometry into the laminated and hard-baked substrate blanks. In operation, the resultant hard-baked etch mask protects the unexposed substrate portions from the etchant for extended periods, effectively resisting the undercutting along the chromium-substrate interface typical of chromium-gold masks as taught by the prior art. In the foregoing exemplary application, the method of the above identified invention provides low cost, durable masks formable in batch processing using standard photolithography techniques for accurately microstructuring anodically bondable glass materials and other structurable glass materials such as quartz and fused silica, whereby features are etched in through the entire thickness of 700+ micrometer thick substrate blanks with little undesirable undercutting of the etch masks. In this example, undesirable lateral etching is on the order of only 25 micrometers per side through the entire 700+ micrometer thickness. Following the hot HF etching process, the structured substrates are rinsed and dried and the photoresist is stripped in a heated alkali or caustic solution.

Those of ordinary skill in the relevant art recognize that the present invention is not limited to the mask forming method described above and shown in the FIGURES. For example, the relative concentrations of $NH_4F$ and HF in the heated BOE solution may vary while remaining effective for the practice of the present invention. Similarly, the relative thicknesses of Cr and Au, or another suitable second metalization layer may vary without limiting the effective practice of the invention. In another example, the method may incorporate different photoresist materials than those discussed and different processes for applying and processing them. However, the above described process uses commonly available equipment and has been shown to be effective in production situations.

Although the foregoing invention has been described in detail for purposes of clarity, it will be obvious to those of ordinary skill in the relevant art that certain modifications may be practiced within the scope of the appended claims. For example, although the present invention is particularly useful for microstructuring microsensors and microactuators, it may also be used for microstructuring glass materials generally.

I claim:

1. A method for manufacturing etch masks useful in structuring glass substrates by a final etching step of the substrate, said method comprising the steps of:
   depositing an adhesion layer onto a surface of a glass substrate;
   defining predetermined mask details in a layer of photoresist material applied over said adhesion layer;
   forming said predetermined mask details into said adhesion layer; and
   subsequent to said forming step but prior to any final etching step baking said adhesion and said photoresist layers.

2. The method recited in claim 1, wherein said depositing an adhesion layer comprises depositing a layer of chromium.

3. The method recited in claim 2, wherein:
   said layer of chromium defines a first metalization layer; and
   said depositing an adhesion layer further comprises depositing at least a second metalization layer over said first metalization layer.

4. The method recited in claim 3, wherein said second metalization layer comprises a metal that is resistant to buffered oxide etchant (BOE) solutions.

5. The method recited in claim 4, wherein said second metalization layer is formed of a metal different from said first metalization layer material.

6. The method recited in claim 3, wherein said second metalization layer comprises a metal selected from the group consisting of gold, platinum, copper, and nickel.

7. The method recited in claim 1, wherein said defining further comprises photolithographically defining said predetermined mask details.

8. The method recited in claim 7, wherein said forming further comprises etching portions of said adhesion layer exposed by said photolithographically defining of said predetermined mask details.

9. The method recited in claim 8, wherein said layer of photoresist material is applied over said adhesion layer using a heated roll-bonding process.

10. The method recited in claim 9, wherein said layer of photoresist material is a layer of negative resist laminate.

11. The method recited in claim 1, wherein said baking further comprises exposing said adhesion and said photoresist material layers to a predetermined elevated temperature for a predetermined time period.

12. A method for manufacturing etch masks useful in structuring glass substrates, the method comprising the steps of:
   depositing an adhesion layer onto a surface of the glass substrate,
   defining predetermined mask details in a layer of photoresist material applied over said adhesion layer,
   forming said predetermined mask details into said adhesion layer, and
   baking said adhesion and said photoresist layers by exposing said adhesion and said photoresist layers to a temperature in the approximate range of 138° C. to 142° C. for a time period in the approximate range of 0.75 to 1.25 hours.

13. A method for manufacturing glass masks useful in structuring glass materials by a final etching step of the glass material, said method comprising the steps of:
   depositing a metallic adhesion layer onto opposing surfaces of a glass substrate;
   coating the exposed surfaces of one or more metallic adhesion layers distal from the surfaces of the glass substrate with a layer of photoresist material;
   lithographically defining predetermined mask details in said layer of photoresist material;
   etching said mask details through the thickness of each of said one or more metallic adhesion layers, whereby predetermined portions of the surfaces of the glass substrate are exposed; and
   subsequent to said etching step but prior to any final glass etching step, hard baking the resultant mask structure.

14. The method recited in claim 13, wherein said metallic adhesion layer comprises a layer of chromium sufficiently thick to effectively protect the glass substrate during a subsequent structuring process.

15. The method recited in claim 13, wherein said metallic adhesion layer comprises:
   a first relatively thin layer of chromium deposited onto opposing surfaces of a glass substrate; and
   a second relatively thick metalization layer deposited over said layer of chromium, said second metalization layer comprising a metal resistant to buffered oxide etchant (BOE) solutions.

16. The method recited in claim 15, wherein said second metalization layer comprises a metal selected from the group consisting of gold, platinum, copper, and nickel.

17. The method recited in claim 13, wherein said lithographically defining of said predetermined mask details comprises photolithographically defining of said predetermined mask details.

18. The method recited in claim 13, wherein said baking further comprises exposing said resultant mask structure to a predetermined elevated temperature for a predetermined time period.

19. A method for manufacturing etch masks useful in structuring glass materials, the method comprising the steps of:
   depositing a metallic adhesion layer onto opposing surfaces of a glass substrate;
   coating the exposed surfaces of one or more metallic adhesion layers distal from the surfaces of the glass substrate with a layer of photoresist laminate material;
   lithographically defining predetermined mask details in said layer of photoresist laminate material;
   etching said mask details through the thickness of each of said one or more metallic adhesion layers, whereby predetermined portions of the glass substrate are exposed; and
   hard baking the resulting mask, wherein said hard-baking further comprises exposing said resulting mask to a temperature in the approximate range of 140° C.+/−2° C. for a time period in the approximate range of 1+/−¼ hours.

* * * * *